United States Patent
Otto et al.

(10) Patent No.: US 6,531,664 B1
(45) Date of Patent: Mar. 11, 2003

(54) SURFACE MOUNT DEVICES WITH SOLDER

(75) Inventors: Thomas M. Otto, Brookfield, WI (US); Carl Frederick Berardinelli, Russiaville, IN (US); Galen J. Reeder, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/286,325

(22) Filed: Apr. 5, 1999

(51) Int. Cl.[7] .............................. H05K 1/16; H05K 3/32; H05K 3/34
(52) U.S. Cl. ................. 174/260; 174/261; 174/256; 361/767; 361/768; 361/774; 257/737; 257/775; 257/778; 228/180.22; 438/612; 438/613; 29/843; 29/840
(58) Field of Search ........................ 29/843, 830, 825, 29/840, 860, 832; 361/777, 767, 768, 771, 774; 174/250, 261, 260, 263, 256–259; 257/779, 778, 786, 738, 737, 775; 438/108, 612, 613; 228/180.22, 246

(56) References Cited

U.S. PATENT DOCUMENTS

| | | | | |
|---|---|---|---|---|
| 4,914,814 A | * | 4/1990 | Behum et al. .................. | 29/843 |
| 5,255,431 A | * | 10/1993 | Burdick ......................... | 29/840 |
| 5,569,960 A | * | 10/1996 | Kumazawa et al. ........ | 257/738 |
| 5,674,785 A | * | 10/1997 | Akram et al. ................ | 437/217 |
| 5,739,585 A | * | 4/1998 | Akram et al. ................ | 257/698 |
| 5,821,456 A | * | 10/1998 | Willie ......................... | 174/52.2 |
| 5,828,128 A | * | 10/1998 | Higashiguchi et al. ........ | 257/738 |
| 6,251,765 B1 | * | 6/2001 | Fukano et al. ............... | 438/612 |
| 6,303,993 B1 | * | 10/2001 | Wark ............................ | 257/737 |

FOREIGN PATENT DOCUMENTS

JP 61-296729 * 12/1986 .................. 29/832

OTHER PUBLICATIONS

Holub et al, Effect of Solder Joint Geometry on the predicted Fatigue Life of the BGA Solder Joints, Thermal Phenomena in Electronic Systems, IEEE Catalog No. 96CH35940, pp. 187–194, Jun. 1996.*

* cited by examiner

*Primary Examiner*—A. Dexter Tugbang
(74) *Attorney, Agent, or Firm*—Jimmy L. Funke

(57) ABSTRACT

A method for controlling the shape and height of solder connections of a surface mount circuit device, such as a flip chip, by way of controlling the manner and extent to which solder is able to flow on a conductor during reflow in order to maximize the distance between adjacent connections. The device is mounted to a circuit board with a conductor pattern defined by a number of conductors, each having a reduced-width portion. A mask is formed on the circuit board to have an opening that exposes a portion of each reduced-width portion, each exposed portion having opposing first and second ends. The device has solder bumps that are staggered so that every other solder bump is registered with a first end of one of the exposed portions, and so that the remaining intervening solder bumps are registered with the opposing second ends of the remaining exposed portions. The solder bumps are then reflowed, during which the solder bumps registered with the first ends of the exposed portions flow toward the corresponding second ends of their exposed portions, and the solder bumps registered with the second ends of the exposed portions flow toward the corresponding first ends of their exposed portions.

8 Claims, 1 Drawing Sheet

SURFACE MOUNT DEVICES WITH SOLDER

TECHNICAL FIELD

The present invention generally relates to surface mount (SM) circuit devices that are attached to conductor patterns with solder connections formed by reflow soldering. More particularly, this invention relates to a method for controlling the height of such solder connections, and preventing shorting between adjacent connections.

BACKGROUND OF THE INVENTION

A flip chip is generally a monolithic surface mount (SM) semiconductor device, such as an integrated circuit, having bead-like terminals formed on one of its surfaces. The terminals, typically in the form of solder bumps, serve to both secure the chip to a circuit board and electrically interconnect the flip chip circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of solder bumps is required. The solder bumps are typically located at the perimeter of the flip chip on electrically conductive pads that are electrically interconnected with the circuitry on the flip chip. The size of a typical flip chip is generally on the order of a few millimeters per side, resulting in the solder bumps being crowded along the perimeter of the flip chip.

Because of the narrow spacing between adjacent solder bumps and conductors, soldering a flip chip to its conductor pattern requires a significant degree of precision. Reflow solder techniques are widely employed for this purpose, and typically entail precisely depositing a controlled quantity of solder on the flip chip using methods such as electrodeposition. Once deposited, heating the solder above its liquidus temperature serves to form the characteristic solder bumps on the surface of the flip chip. After cooling to solidify the solder bumps, the chip is soldered to the conductor pattern by registering the solder bumps with their respective conductors and then reheating, or reflowing, the solder so as to metallurgically adhere, and thereby electrically interconnect, each solder bump with its corresponding conductor, forming what will be referred to herein as a solder connection.

Placement of the chip and reflow of the solder must be precisely controlled not only to coincide with the spacing of the terminals and the size of the conductors, but also to control the height of the solder connections after soldering. As is well known in the art, controlling the height of solder connections after reflow is often necessary to prevent the surface tension of the molten solder from drawing the flip chip excessively close to the substrate during the reflow operation. Sufficient spacing between the chip and its substrate, often termed the stand-off height, is desirable for allowing penetration of cleaning solutions for removing undesirable processing residues, promoting the penetration of mechanical bonding and encapsulation materials between the chip and its substrate, and enabling stress relief during thermal cycles. Solder bump position and height are generally controlled by the amount of solder deposited on the flip chip to form the solder bump and/or by the use of solder stops that limit the surface area over which the solder bump is allowed to reflow. Solder stops are typically formed by a solder mask on laminate substrates and printed dielectric on ceramic substrates. Because flip chip solder bumps are registered and soldered directly to their conductors, the conductors must be formed of a solderable material, which as used herein means that a tin, lead or indium-based alloy is able to adhere to the conductor through the formation of a metallurgical bond. Solder stops are intentionally formed of a nonsolderable material, meaning that a tin, lead or indium-based solder will not adhere to the material for failure to form a metallurgical bond. Upon reflow, the reflow area defined by a solder stop on a conductor yields a solder connection typically having a semi-spherical shape and circular cross-section.

While solder stops are widely used in the art, trends in the industry have complicated their ability to yield solder connections that provide an adequate flip chip stand-off height. As flip chips have become more complex, the number of bumps that must be accommodated along the chip perimeter has increased. In turn, the conductors to which the bumps are registered and soldered have become more closely spaced and narrower, e.g., a pitch of about 0.010 inch (about 0.25 millimeter) or less and line widths of about 0.004 inch (about 0.1 millimeter), yielding a line spacing of about 0.006 inch (about 0.15 millimeter) or less. Fine conductor pitches complicate the design and fabrication of solder stops, particularly on laminate substrates with the result that pitches of less than 0.010 inch have not been widely used. As a result, solder connections having adequate stand-off height are more difficult to consistently produce, which increases the difficulty of adequately dispersing encapsulation materials between flip chips and their substrates. Shorts between adjacent solder connections are also more likely to occur due to excessive lateral flow of the solder during reflow.

Accordingly, it would be desirable if an improved method were available that could control the stand-off height of a surface mount device following solder bump reflow, while also reducing the incidence of shorting between solder connections if the device must be registered with a fine pitch conductor pattern.

SUMMARY OF THE INVENTION

The present invention provides a method for controlling the shape and height of solder connections of a surface mount circuit device, such as a flip chip, by way of controlling the manner and extent to which solder is able to flow on a conductor during reflow. Solder connections formed by the method of this invention are characterized by having shapes that promote maximize the distance between adjacent connections so that the incidence of shorting between solder connections is reduced, while achieving a suitable stand-off height for the device.

According to this invention, the above is achieved by forming on a circuit board a conductor pattern defined by a number of conductors, each having a reduced-width portion. A mask is formed on the circuit board to have an opening that exposes at least a portion of each of the reduced-width portions of the conductors, with each exposed portion having opposing first and second ends. A circuit device having a staggered pattern of solder bumps is then placed on the circuit board so that each solder bump is registered with one of the exposed portions of the conductors. More particularly, the solder bumps are staggered on the circuit device so that every other solder bump is registered with a first end of one of the exposed portions, and so that the remaining intervening solder bumps are registered with the opposing second ends of the remaining exposed portions. The solder bumps are then reflowed to form solder connections between the circuit device and the conductors. During reflow, the solder bumps registered with the first ends of the exposed portions flow toward the corresponding second ends of the exposed portions, and the solder bumps registered with the second ends of the exposed portions flow toward the corresponding first ends of the exposed portions.

The result of the method described above is that the solder connections are wider at the end of the exposed portion with which its corresponding solder bump was registered, and the width of each solder connection is tapered to become narrower toward the opposing end of its exposed portion. Because of the original staggered arrangement of the solder bumps, the solder connections of every other conductor are tapered in a first direction, and the remaining solder connections of the intervening conductors are tapered in the opposite direction. For a given conductor pitch, the invention achieves a relatively greater distance between solder connections than possible with conventional solder connections having circular cross-sections, with the result that the likelihood of shorting between adjacent solder connections is significantly reduced. In addition, adequate stand-off height is maintained by the wider ends of the solder connections to allow penetration of cleaning solutions, promote the penetration of mechanical bonding and underfill materials between the device and its substrate, and promote stress relief in the solder connections during thermal cycling.

Other objects and advantages of this invention will be better appreciated from the following detailed description.

BRIEF DESCRIPTION THE DRAWINGS

DESCRIPTION OF THE PREFERRED EMBODIMENT

Figure 1:
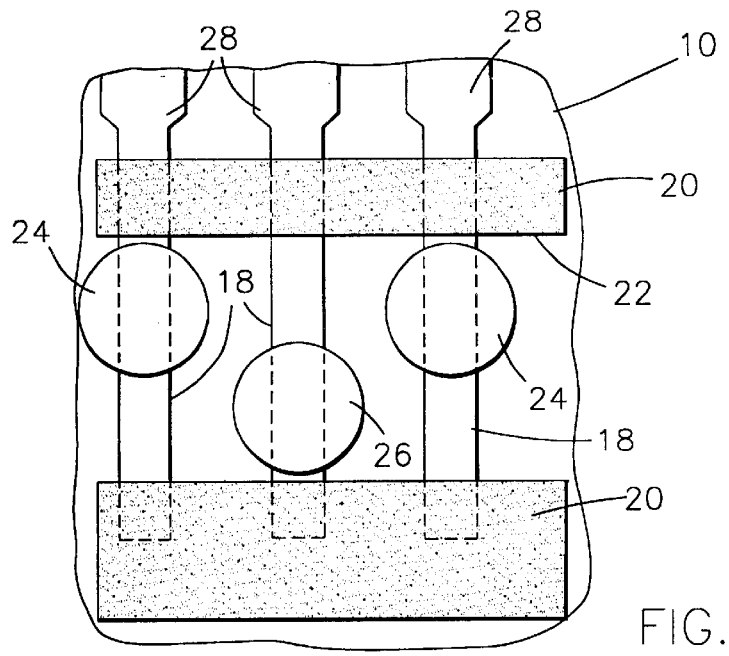
FIG. 1 is a plan view of a portion of a circuit board with solder bump registration indicated in accordance with the present invention.
Figure 2:
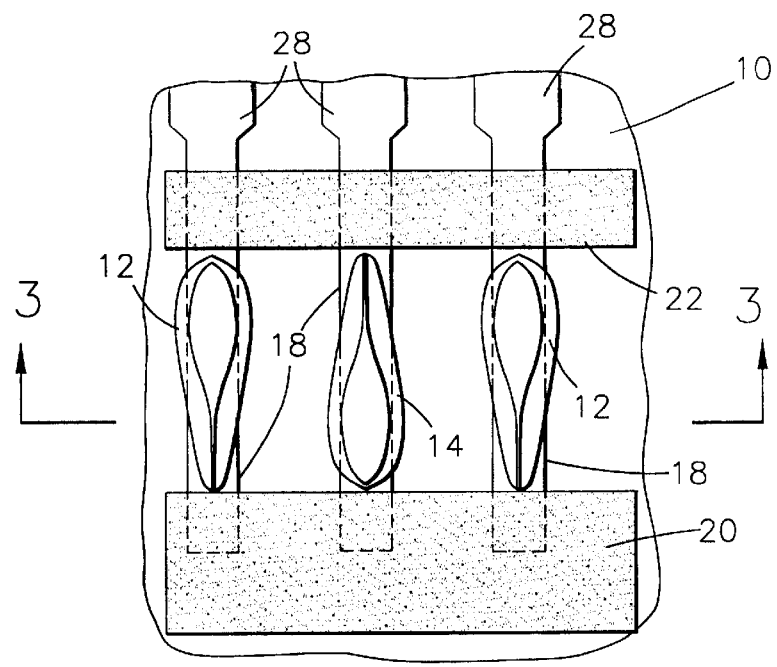
FIG. 2 is a plan view of the circuit board of FIG. 1 following solder bump registration and reflow.
Figure 3:
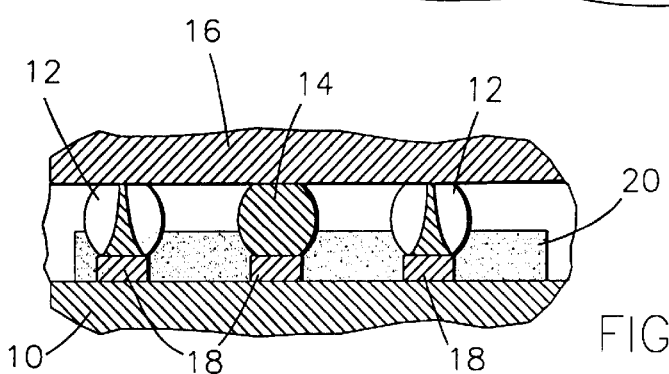
FIG. 3 is a cross-sectional view along section line 3—3 of FIG. 2.

A portion of a circuit board 10 is illustrated in FIGS. 1 through 3 in accordance with this invention. FIGS. 2 and 3 show the circuit board 10 following reflow soldering of a flip chip 16 (shown only in FIG. 3 for clarity) to conductors 28 on the board 10 with solder connections 12 and 14 formed in accordance with this invention. FIG. 1 shows the board 10 and its conductors 28 prior to the reflow soldering operation, with solder bumps 24 and 26 shown in phantom that will be reflowed to form the connections 12 and 14, respectively. While the invention is illustrated and described with reference to a flip chip, those skilled in the art will appreciate that the teachings of the invention are not limited to flip chips, but are more broadly applicable to other surface mounted circuit devices, including ball grid arrays (BGAs), micro-ball grid arrays (mBGAs) and chip scale packages (CSPs).

As typical in the art, the solder connections 12 and 14 are formed by reflowing the solder bumps 24 and 26, which are originally formed on the chip 16 and then registered with the conductors 28 prior to the reflow operation. Suitable solder alloys include, but are not limited to, tin-based, lead-based and indium-based alloys, with notable examples being tin-lead alloys containing about 10 to about 60 percent tin, with possible alloying additions of antimony, silver, etc. These alloys can be reflowed at sufficiently low temperatures to avoid thermal damage to the circuitry of the flip chip 16 and circuit board 10. The solder alloy for the bumps 24 and 26 can be screen printed or electrodeposited on contact pads (not shown) on the flip chip 16, as is conventional. The solder must be accurately deposited in limited amounts such that, after reflow, the solder bumps 24 and 26 will be substantially of 10 equal size and will accurately and uniquely register with the conductors 28 when the chip 16 is registered with the conductor pattern. After registration, the solder bumps 24 and 26 are reflowed by heating so that the molten solder wets and, upon resolidification, metallurgically bonds to the conductors 28, thereby attaching the chip 16 to the conductor pattern and the underlying circuit board 10. Reflow can be achieved by any of a number of techniques well known in the art, and therefore will not be discussed in detail here.

The conductors 28 are printed or otherwise formed on the surface of the circuit board 10, which may be a ceramic substrate, printed wiring board, flexible circuit or silicon substrate, as is known in the art. The conductors 28 are formed of a solderable material, which denotes a material to which solder will metallurgically bond and reliably adhere for purposes of making an electrical interconnection, as determined in the art using known test methods. A preferred conductor material for laminate circuit boards (e.g., FR4) is planar copper deposited by plating or by lamination of a copper foil, with a suitable thickness being about 0.015 to about 0.040 millimeters. Examples of suitable conductor materials for ceramic circuit boards include various silver-platinum and silver-palladium alloys used to form thick film conductors. Notable examples are thick film conductor compositions identified as QS179, Q170P and 7484F, each of which is produced and commercially available from E. I. DuPont de Nemours and Company, Inc., of Wilmington, Del.

As seen in FIGS. 1 and 2, each of the conductors 28 has a reduced-width portion 18. The widths of these portions 18 are preferably the same, and can be typically about 10% to about 50% less than the remainder of their respective conductors 28. The width of each portion 18 is critical to achieving the objects of this invention. In practice, suitable widths for the conductors 28 and their reduced-width portions 18 are about 0.004 and about 0.003 inch (about 100 and about 75 micrometers), respectively, with a suitable pitch being about 0.010 inch (about 250 micrometers) or less.

A solder mask 20 is shown in the Figures as overlying the circuit board 10, with an opening 22 being defined in the mask 20 to expose a limited length of the reduced-width portion 18 of each conductor 28. As shown in FIGS. 1 and 2, the opening 22 preferably exposes the same length of each portion 18, roughly about twice the diameter of the solder bumps 24 and 26. The solder mask 20 is preferably a photoresist material so that the opening 22 can be defined by known photoengraving techniques. The opening 22 can be sized to expose portions of any number of conductors 28, and a single opening 22 can be formed to expose a portion of each conductor 28 of the entire conductor pattern. The resulting opening 22 is roughly a rectangular-shaped trench corresponding to the square pattern formed by the solder bumps 24 and 26 when located along the perimeter of the chip 16.

As seen from FIG. 1, the solder bumps 24 and 26 are not aligned on the chip 16, but instead are staggered. As depicted in FIG. 1, the solder bumps 24 are registered with every other conductor 28, and are located closer to the end of each exposed conductor area that is closer to the interior of the chip 16, while the solder bumps 26 are located at the opposite ends of the exposed areas of the intervening conductors 28, i.e., closer to the perimeter of the chip 16.

During reflow, the molten solder bumps 24 and 26 will flow toward the opposite ends of their respective exposed conductor areas, the result of which is portrayed in FIG. 2. The width and length of the area of each reduced-width portion 18 exposed through the opening 22 determines the extent to which molten solder flows during solder reflow. As evident from FIG. 2, each of the solder connections 12 and 14 is generally tear-shaped, with a wider portion being in the region of the conductor 28 where the original solder bump 24 or 26 was registered. Because the connections 12 and 14 taper in opposite directions due to the staggering of the solder bumps 24 and 26, the clearance between adjacent connections 12 and 14 is significantly greater than if the connections 12 and 14 were tapered in the same direction or were not tapered at all, i.e., circular in accordance with the prior art. As a result, the opposite orientations of the solder connections 12 and 14 provide for greater clearance, which reduces the risk of shorts when fine conductor pitches are used.

In addition to the size of the solder bumps 24 and 26, the size of the exposed area of each conductor 28 determines the height of its solder connection 12 or 14. As the molten solder coalesces during reflow, the surface tension of the solder constrains the final shape of the solder connections 12 and 14 in accordance with the size and shape of the exposed area of their conductors 28. The lengths that can be exposed of the conductors 28 to achieve the objects of this invention can vary. The exposed length of each reduced-width portion 18 is shown in the Figures as being about three times greater than its width. For example, for a width of about 0.003 inch (about 75 micrometers), a suitable exposed length is about 0.010 inch (about 250 micrometers). The accuracy with which the dimensions of the opening 22 can be tailored by printing and photo-imaging techniques enables the exposed lengths of the conductors 28, and therefore the shape and height of the solder connections 12 and 14, to be tailored to some degree.

While the invention has been described in terms of a preferred embodiment, it is apparent that other forms could be adopted by one skilled in the art. Accordingly, the scope of the invention is to be limited only by the following claims.

What is claimed is:

1. An assembly comprising:
   a circuit board;
   conductors that define a conductor pattern on the circuit board, each of the conductors having a reduced-width portion;
   a mask overlying the conductor pattern, the mask having an opening that exposes at least a portion of the reduced-width portion of each conductor, the exposed portion of each reduced-width portion having opposing first and second ends;
   a circuit device attached to the exposed portions of the conductors with solder connections, the solder connections of every other conductor in the conductor pattern being wider at the first ends of the exposed portions thereof than at the second ends thereof, the solder connections of intervening conductors being wider at the second ends of the exposed portions thereof than at the first ends thereof, wherein the solder connections of the intervening conductors alternate with the solder connections of every other conductor of the conductor pattern.

2. The assembly set forth in claim 1, wherein each of the solder connections has a substantially tear-shaped cross-section.

3. The assembly set forth in claim 1, wherein the exposed portions of the conductors have substantially equal lengths.

4. The assembly set forth in claim 1, wherein the exposed portions have substantially equal widths.

5. The assembly set forth in claim 1, wherein each of the exposed portions has a length that is greater than a width thereof the exposed portion.

6. The assembly set forth in claim 1, wherein each of the exposed portions has a length that is about three times greater than a width thereof the exposed portion.

7. The assembly set forth in claim 1, wherein the conductors are spaced a distance apart, and wherein the exposed portions of the conductors have widths that are less than the distance between the conductors.

8. The assembly set forth in claim 1, wherein the conductors are formed of a solderable material.

\* \* \* \* \*